United States Patent
Xie et al.

(10) Patent No.: US 12,218,063 B2
(45) Date of Patent: Feb. 4, 2025

(54) EMIB ARCHITECTURE WITH DEDICATED METAL LAYERS FOR IMPROVING POWER DELIVERY

(71) Applicant: Intel Corporation, Santa Clara, CA (US)

(72) Inventors: Jianyong Xie, Chandler, AZ (US); Sujit Sharan, Chandler, AZ (US); Huang-Ta Chen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1175 days.

(21) Appl. No.: 16/810,192

(22) Filed: Mar. 5, 2020

(65) Prior Publication Data

US 2021/0280518 A1  Sep. 9, 2021

(51) Int. Cl.
| | |
|---|---|
| *H01L 23/538* | (2006.01) |
| *H01L 23/00* | (2006.01) |
| *H01L 23/498* | (2006.01) |
| *H01L 23/64* | (2006.01) |
| *H01L 25/18* | (2023.01) |

(52) U.S. Cl.
CPC .... *H01L 23/5381* (2013.01); *H01L 23/49827* (2013.01); *H01L 23/5386* (2013.01); *H01L 23/642* (2013.01); *H01L 24/16* (2013.01); *H01L 25/18* (2013.01); *H01L 2224/16227* (2013.01)

(58) Field of Classification Search
None
See application file for complete search history.

(56) References Cited

U.S. PATENT DOCUMENTS

| | | | | |
|---|---|---|---|---|
| 5,110,664 | A * | 5/1992 | Nakanishi | H05K 3/4605 428/209 |
| 5,488,542 | A * | 1/1996 | Ito | H05K 1/024 361/767 |
| 7,148,503 | B2 * | 12/2006 | Fujimura | G06F 15/7867 257/E23.179 |
| 2004/0184219 | A1 * | 9/2004 | Otsuka | H01L 23/49805 257/E23.079 |

* cited by examiner

*Primary Examiner* — Hung K Vu
(74) *Attorney, Agent, or Firm* — Schwabe, Williamson & Wyatt, P.C.

(57) ABSTRACT

Embodiments disclosed herein include electronic packages with a bridge that comprise improved power delivery architectures. In an embodiment, a bridge comprises a substrate and a routing stack over the substrate. In an embodiment, the routing stack comprises first routing layers, where individual ones of the first routing layers have a first thickness, and a second routing layer, where the second routing layer has a second thickness that is greater than the first thickness.

23 Claims, 9 Drawing Sheets

EMIB ARCHITECTURE WITH DEDICATED METAL LAYERS FOR IMPROVING POWER DELIVERY

TECHNICAL FIELD

Embodiments of the present disclosure relate to semiconductor devices, and more particularly to embedded multi-die interconnect bridge (EMIB) architectures for improved power delivery.

BACKGROUND

Packaging using embedded multi-die interconnect bridge (EMIB) architectures provides high-density interconnects between heterogeneous dies on a single package by embedding a bridge (e.g., a silicon bridge) in the package substrate. While EMIB architectures offer many advantages, including high IO count per millimeter and small area, EMIB architectures also leave room for further performance improvements One such area for performance improvement is that the bridge prevents access to the overlying dies from below. As such, the power delivery path needs to pass around the embedded bridge. Without a direct vertical power delivery path, current is forced to travel horizontally along traces over the package substrate surface. This leads to higher resistance and AC inductance, especially when the power supply cannot be fed into the die along multiple edges.

One proposed solution is to utilize through bridge vias (e.g., through silicon vias (TSVs)) through the bridge. While providing a direct vertical access point, the addition of TSVs to the fabrication of the bridge adds a significant cost.

EMBODIMENTS OF THE PRESENT DISCLOSURE

Described herein are electronic packages with embedded multi-die interconnect bridge (EMIB) architectures for improved power delivery, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
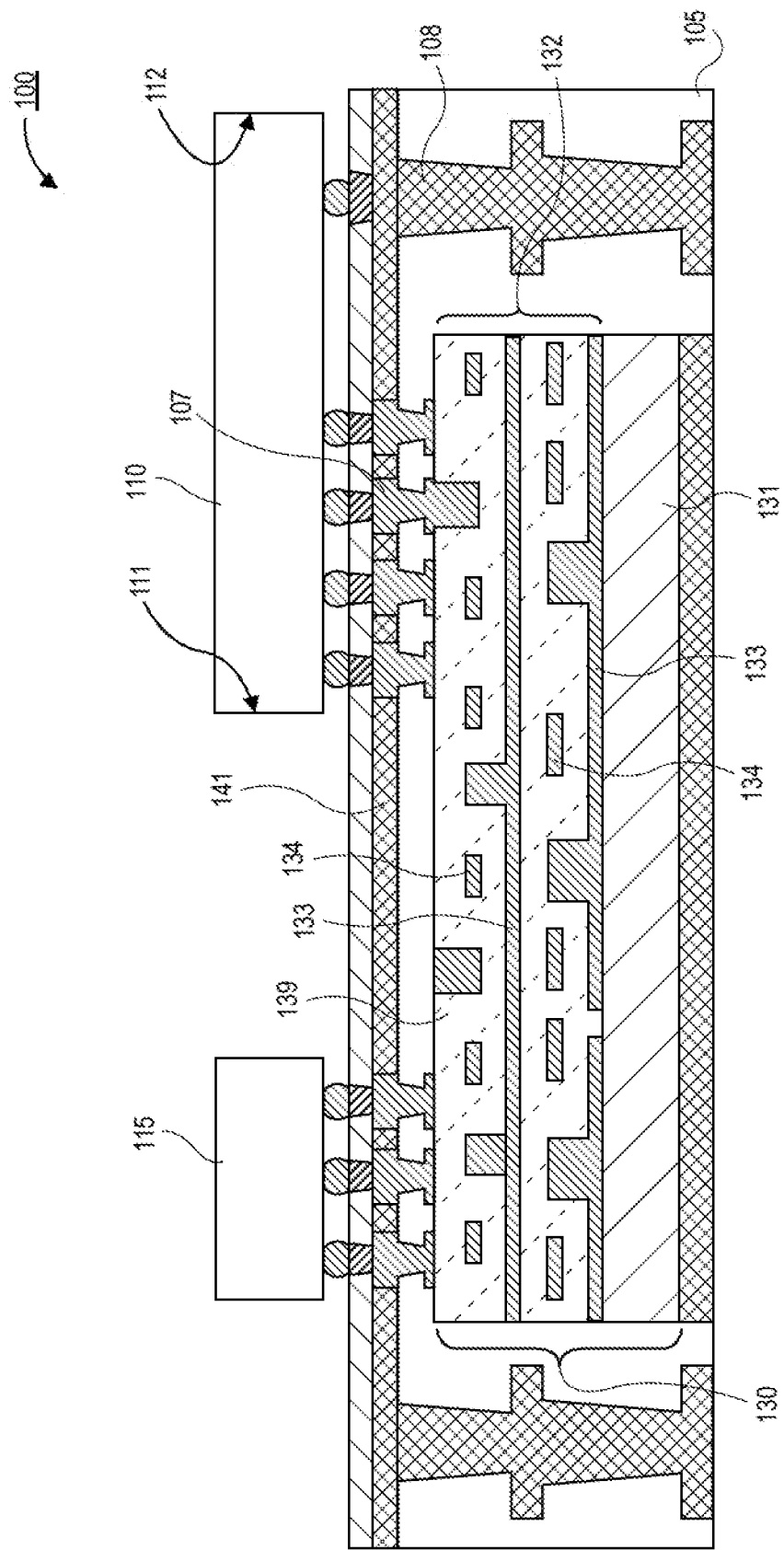
FIG. 1A is a cross-sectional illustration of an electronic package with an EMIB architecture that relies on traces on the package surface to supply power to the dies.

As noted above, limits in power delivery options in EMIB architectures is a potential drawback to the use of such architectures in various applications. An example of an electronic package 100 with an EMIB architecture is shown in FIG. 1A. The electronic package 100 may comprise a package substrate 105, a first die 110, and a second die 115. A bridge 130 may electrically couple the first die 110 to the second die 115. The bridge 130 may comprise a substrate 131 (e.g., a silicon substrate) and a routing stack 132 (e.g., a back end of line (BEOL) stack). The routing stack 132 may comprise signal routing layers 134 (referred to simply as signal layers 134) and reference routing layers 133 (referred to simply as reference layers) that are embedded in an insulative material 139 (e.g., $SiO_2$).

Due to the presence of the bridge 130 below portions of the first die 110 and the second die 115, there is no access from below for supplying power directly from the package substrate 105. Furthermore, power cannot typically be distributed along the signal layers 134. This is because the resistance would be too high. Typically, the reference layers 133, which serves as signaling referencing layers, can carry certain current for IO power or ground. However, it may not be suitable for other power rails. For example, the signal layers 134 and the reference layers 133 typically have a thickness of approximately 2 μm.

In FIG. 1A, a single power rail is supplied to the first die 110. Particularly, power is supplied from the right edge 112 (i.e., the edge facing away from the second die 115) by a via 108 through the package substrate, and power is mainly supplied from the left edge 111 (i.e., the edge facing the second die 115) by trace 141 over a surface of the package substrate 105 that contacts pads 107 on the surface of the package substrate 105. Typically, power needs to be supplied from both edges in order to reduce the voltage drop. As a result, only a single power rail can be supported. That is, for an IO PHY, one of a Vdd logic power rail and an IO power rail is provided to the first die 110 from the package substrate 105 surface. Additionally, the use of a trace 141 on the package substrate 105 to supply the power rail leads to higher resistance and AC inductance.

Figure 1B:
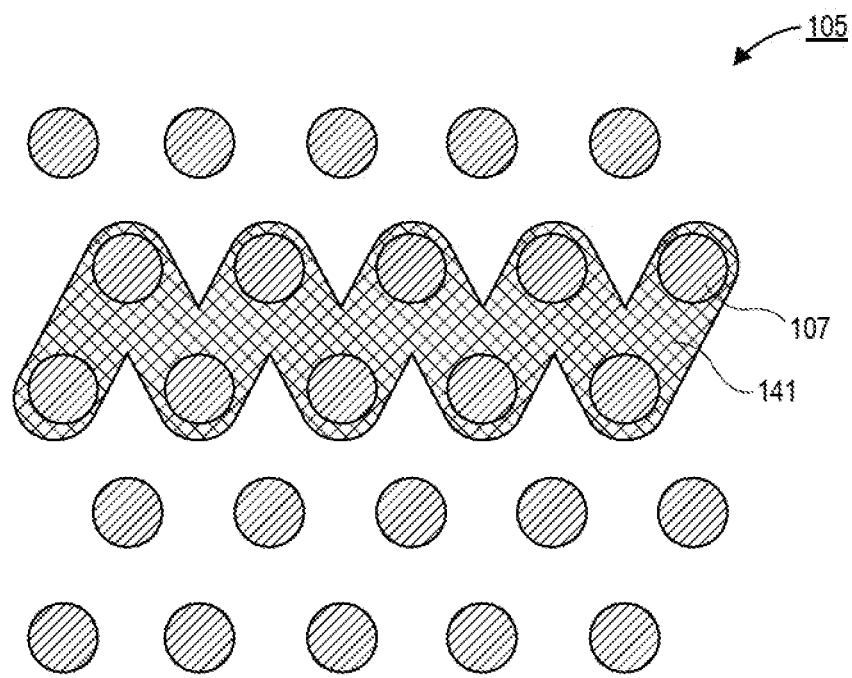
FIG. 1B is a plan view illustration of a bump map of the package substrate that illustrates a trace that passes along a pair of adjacent rows in order to deliver power, and thus constrains bump layout design.

In addition to providing suboptimal electrical performance, the use of a trace 141 on the surface of the package substrate 105 also restricts flexibility of the bump out design. FIG. 1B is a plan view of the package substrate 105 that illustrates a portion of the pads 107 in the bumping region. As shown, in order to provide a continuous trace 141, the pads 107 utilized for the power rail need to be located in adjacent rows, depending on the bump pitch. In some embodiments, a single row may be sufficient to provide the continuous trace 141. Since the pads 107 for supplying the power rail to the first die 110 need to be adjacent to at least one other power pad 107 in order to provide a continuous trace 141, the design flexibility is constrained.

Accordingly, embodiments disclosed herein include EMIB architectures with improved power delivery. Particularly, embodiments disclosed herein may comprise an additional routing layer in the routing stack. The additional routing layer may be a dedicated layer for providing one or more power rails to the dies of the electronic package. In an embodiment, the additional routing layer may have a thickness that is greater than the other routing layers of the routing stack (e.g., the signal layers and the reference layers). As such, the resistance of the power rail is decreased. The inclusion of the power rail within the bridge may also alleviate routing congestion on the surface of the package substrate. As such, multiple power rails (e.g., IO power delivery and core power delivery) may both be accessible to the first die.

The use of an additional routing layer in the routing stack of the bridge provides numerous benefits. Electrically, the thick metal layer in the bridge can reduce the DC resistance, current density, and voltage drop. This benefit is particularly pronounced for power rails that have a single side supply. This also enables longer core circuit encroachment into the IO field above the bridge.

Another advantage is that the power delivery routing layer in the bridge reduces the AC inductance and impedance. This is due to the power routing layer being tightly coupled to the ground plane routing layer in the bridge. The bridge architecture also allows for a metal-insulator-metal (MIM) capacitors to be implemented between the power routing layer and the ground routing layer of the bridge. The MIM capacitors may be implemented across the entire bridge, and for more than one power rail. The on-bridge MIM capacitance significantly improves the power integrity of the EMIB package, including voltage droop and transient noise.

Furthermore, since on package traces are no longer required for power delivery in the IO PHY region, the bump map design flexibility is improved. As noted above, the power and ground bumps need to be arranged in one row or two adjacent rows in order to make the trace connection when using conventional EMIB power delivery schemes to supply power and current to the IO and core area. However, embodiments described herein provide current feeding power and ground that can be directly fed from below by the additional routing layer. As such, the power and ground bumps no longer need to be adjacent to each other.

Additional advantages to the proposed architecture include the ability to improve the power delivery performance of suboptimum dies. For example, in some architectures, a power rail may pass along a metal layer in the BEOL stack of the die. Different manufactures may provide metal layers for power that have different thicknesses. As a result, with respect to power delivery, the resistance of some dies may be higher than others. The embodiments disclosed herein provide a parallel path for power (i.e., along the additional power routing layer in the bridge) that has a low resistance due to the increased thickness. Accordingly, power delivery performance may be substantially agnostic to the manufacturer that supplies the die used in the electronic package.

Figure 2A:
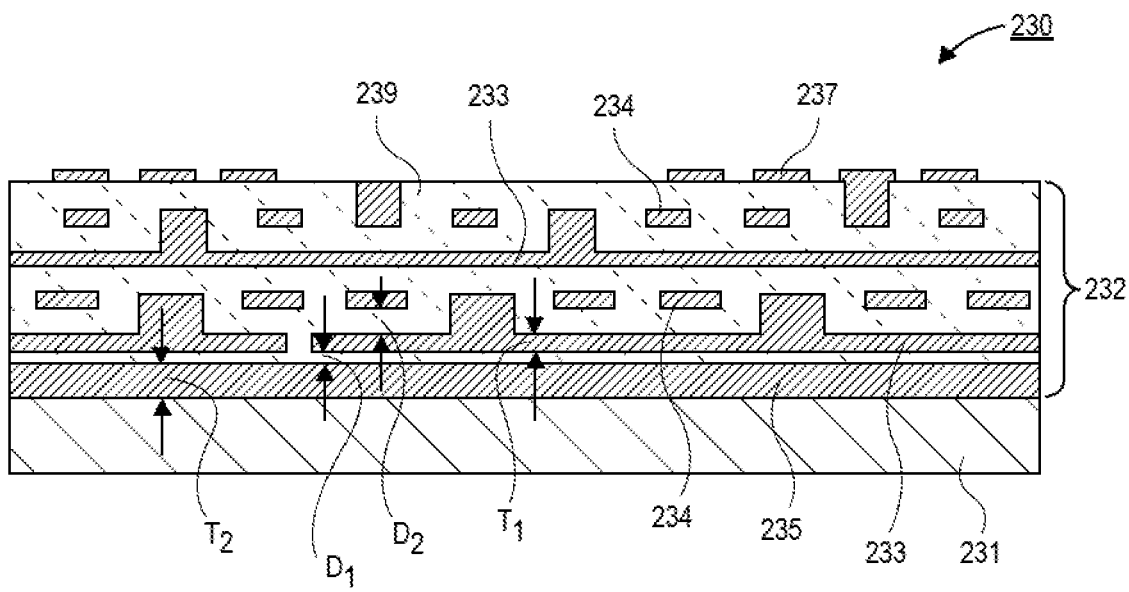
FIG. 2A is a cross-sectional illustration of an EMIB architecture with an additional routing layer with an increased thickness between the substrate and the signal layers, in accordance with an embodiment.

Referring now to FIG. 2A, a cross-sectional illustration of a bridge 230 that may be used in an electronic package with an EMIB architecture is shown, in accordance with an embodiment. In an embodiment, the bridge 230 may comprise a substrate 231 and a routing stack 232 over the substrate 231. The substrate 231 may be any suitable material, such as silicon, glass, ceramic, etc. In an embodiment, the routing stack 232 may be formed with BEOL processes. The routing stack 232 may sometimes be referred to as the BEOL layers, the routing layers, the interconnect layers, or other commonly used terms in the art. The routing stack 232 may comprise a plurality of conductive routing layers (e.g., layers 233, 234, and 235) that are embedded in an insulative material 239. The conductive material of the routing layers 233, 234, and 235 may comprise, for example, copper. In an embodiment, the insulative material 239 may comprise $SiO_2$ or the like. In an embodiment, pads 237 may be disposed over the routing stack 232. Though not shown for simplicity, individual ones of the pads 237 may be coupled to one of the layers 233, 234, or 235 in the routing stack 232.

In an embodiment, five routing layers are shown. In the particular embodiment illustrated in FIG. 2A, there are two routing layers 233, two routing layers 234, and a single routing layer 235. In an embodiment, the routing layers 233 may be reference routing layers (simply referred to herein as "reference layers" 233). For example, the reference layers 233 may be held at ground potential or another reference potential during operation. In an embodiment, a single reference layer 233 may comprise a conductive plane, a plurality of conductive planes, traces, pads, and/or the like. That is, a reference layer 233 may refer to one or more conductive features within a single layer of the routing stack 232. The reference layers 233 are used by the signal routing layers 234 (simply referred to herein as "signal layers" 234) to provide improved signal quality. It is to be appreciated that within a single signal layer 234 there may be a plurality of discrete traces. That is, a signal routing layer 234 may refer to one or more traces within a single layer of the routing stack 232.

In an embodiment, the reference layers 233 and the signal layers 234 may be in an alternating pattern. That is, the topmost layer may be a signal layer 234, the next lower layer may be a reference layer 233, the next lower layer may be a signal layer 234, and the next lower layer may be a reference layer. In the illustrated embodiment, two reference layers 233 and two signal layers 234 are shown. However, it is to be appreciated that embodiments may include any number of reference layers 233 and any number of signal layers 234.

In an embodiment, the bridge 230 may further comprise a power delivery routing layer 235 (referred to simply as "power delivery layer" 235). In the illustrated embodiment, the power delivery layer 235 is located within the routing stack 232 below the signal layers 234. That is, the power delivery layer 235 may be positioned between the signal layers 234 and the substrate 231. In an embodiment, the power delivery layer 235 is a solid conductive plane (e.g., a copper plane). In other embodiments, the power delivery layer 235 comprises a conductive meshed plane. In some additional embodiments, the power delivery layer 235 may comprise a plurality of sub-layers. The sub-layers may each have a thickness between approximately 1 μm and 4 μm.

In order to provide a lower resistance along the power delivery layer 235, the power delivery layer 235 may have a thickness that is greater than a thickness of the other layers (i.e., reference layers 233 and signal layers 234) of the routing stack 232. For example, the power delivery layer 235 may have a second thickness $T_2$ that is greater than a first thickness $T_1$ of the reference layers 233 (and the signal layers 234). In an embodiment, the second thickness $T_2$ is approximately twice the first thickness $T_1$. As used herein "approximately" may refer to a value that is within approximately 10% of the referenced value. In a particular embodiment, the second thickness $T_2$ may be approximately 4 μm and the first thickness $T_1$ may be approximately 2 μm. In an embodiment, the second thickness $T_2$ may be approximately 4 μm or greater. In other embodiments, the second thickness $T_2$ may be between approximately 4 μm and approximately 6 μm.

In an embodiment, a spacing between the power delivery layer 235 and a neighboring reference layer 233 may be smaller than a spacing between the reference layer 233 and the signal layer 234. For example, a first spacing $D_1$ between the power delivery layer 235 and a reference layer 233 may be smaller than a second spacing $D_2$ between the reference layer 233 and the signal layer 234. In an embodiment, the first spacing $D_1$ may be approximately 3 μm or less, or the first spacing $D_1$ may be approximately 1 μm or less. The reduction in the first spacing $D_1$ provides improved power delivery performance, especially when the neighboring reference layer 233 is a ground layer (e.g., Vss). This allows for a tightly coupled power rail and ground layer. As such, the power delivery loop inductance can be greatly reduced.

Figure 2B:
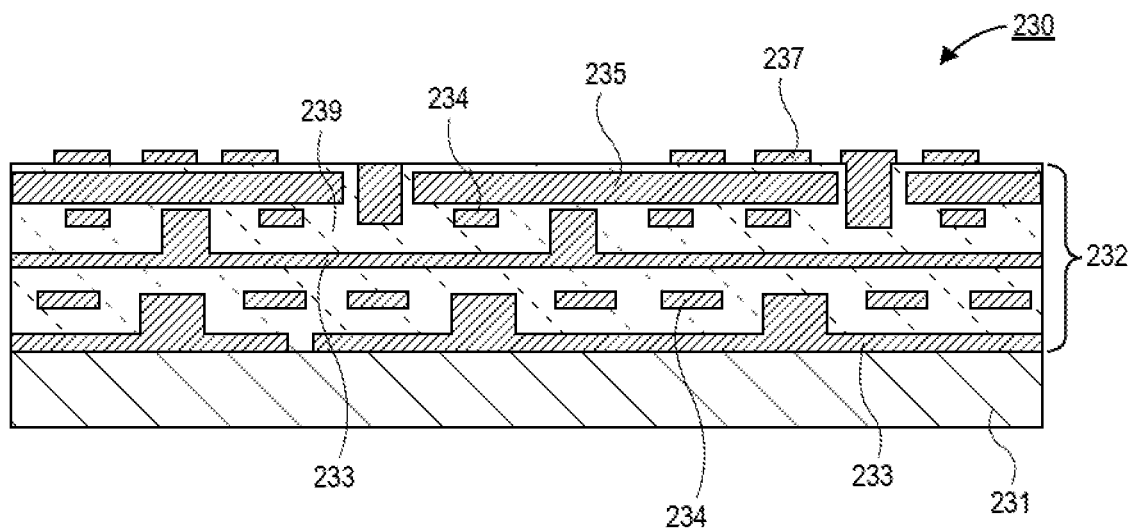
FIG. 2B is a cross-sectional illustration of an EMIB architecture with an additional routing layer with an increased thickness above the signal layers, in accordance with an embodiment.

Referring now to FIG. 2B, a cross-sectional illustration of a bridge 230 is shown, in accordance with an additional embodiment. The bridge 230 in FIG. 2B may be substantially similar to the bridge 230 in FIG. 2A, with the exception of the location of the power delivery layer 235. Particularly, in the embodiment illustrated in FIG. 2B, the power delivery layer 235 is positioned above the signal layers 234. That is, the signal layers 234 may be positioned between the power delivery layer 235 and the substrate 231.

Figure 2C:
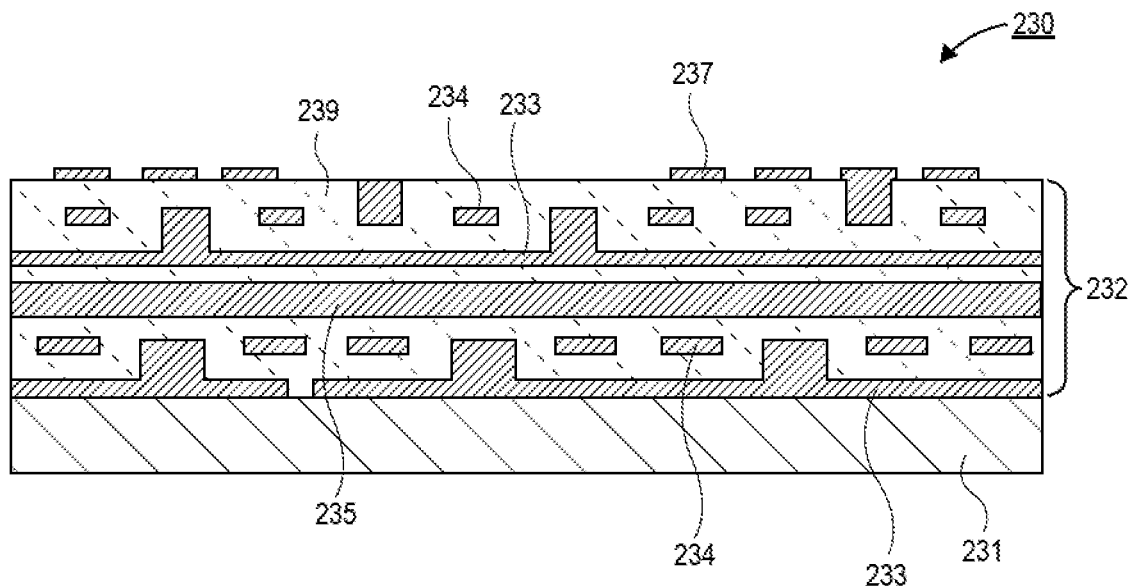
FIG. 2C is a cross-sectional illustration of an EMIB architecture with an additional routing layer with an increased thickness between signal layers, in accordance with an embodiment.

Referring now to FIG. 2C, a cross-sectional illustration of a bridge 230 is shown, in accordance with an additional embodiment. The bridge 230 in FIG. 2C may be substantially similar to the bridge 230 in FIG. 2A, with the exception of the location of the power delivery layer 235. Particularly, in the embodiment illustrated in FIG. 2B, the power delivery layer 235 is positioned between the pair of signal layers 234. As shown, the power delivery layer 235 may be between a signal layer 234 and a reference layer 233.

Figure 2D:
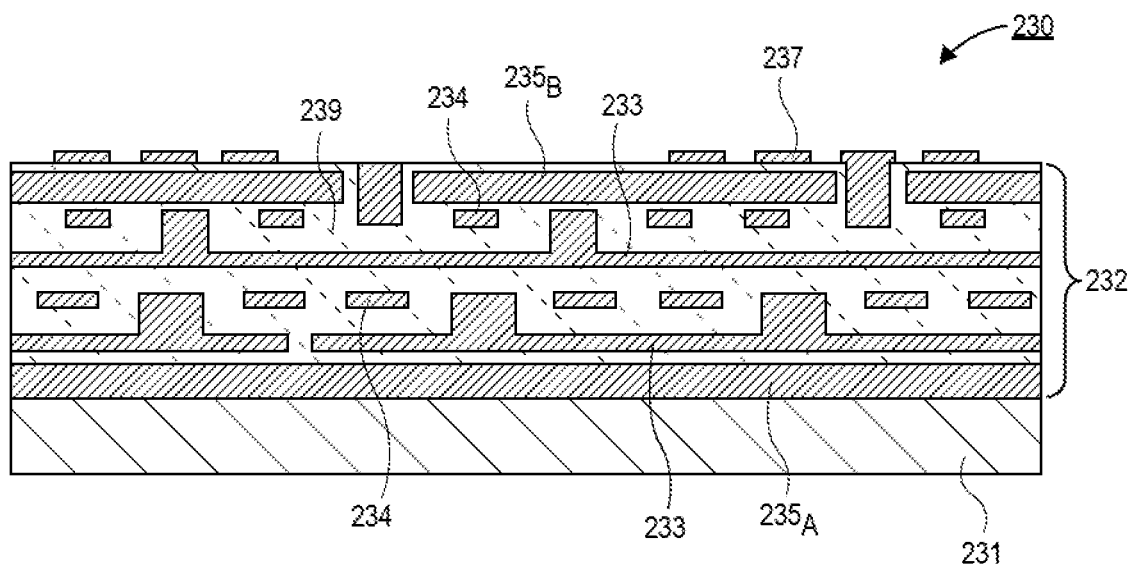
FIG. 2D is a cross-sectional illustration of an EMIB architecture with additional routing layers with an increased thickness above and below the signal layers, in accordance with an embodiment.

Referring now to FIG. 2D, a cross-sectional illustration of a bridge 230 is shown, in accordance with an additional embodiment. The bridge 230 in FIG. 2D may be substantially similar to the bridge 230 in FIG. 2A, with the exception that there is a pair of power delivery layers 235. In an embodiment, a first power delivery layer $235_A$ is between the signal layers 234 and the substrate 231, and a second power delivery layer $235_B$ is above the signal layers 234. In another embodiment, one of the first power delivery layer $235_A$ or the second power delivery layer $235_B$ may alternatively be positioned between the signal layers 234 (similar to the power delivery layer 235 in FIG. 2C). In yet another embodiment, there may be a third power delivery layer (not shown) that is located between the signal layers 234, in addition to the first power delivery layer $235_A$ and the second power delivery layer $235_B$.

Figure 2E:
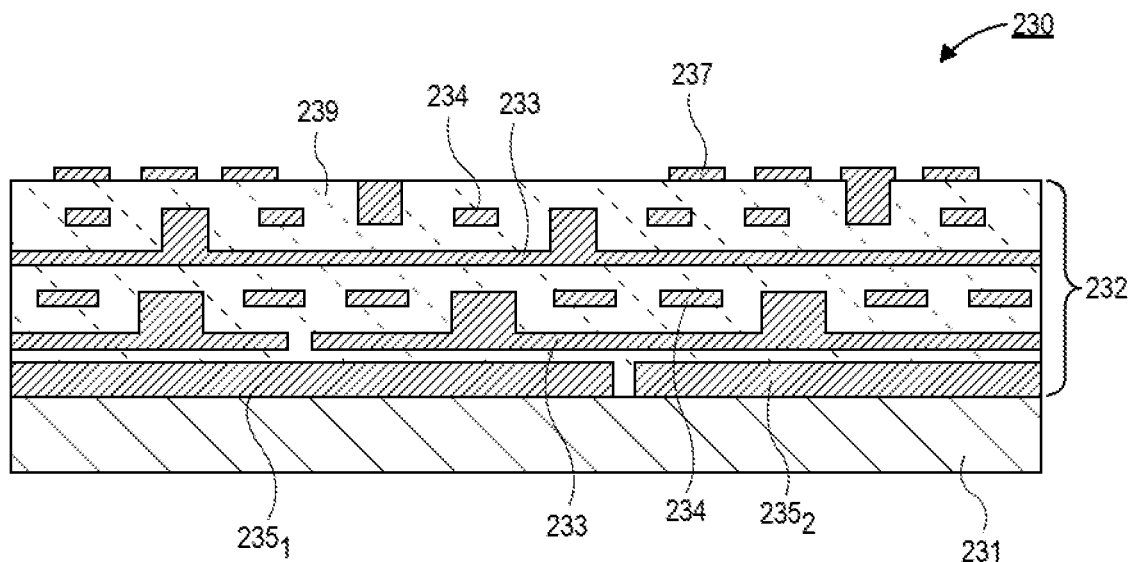
FIG. 2E is a cross-sectional illustration of an EMIB architecture with a segmented additional routing layer with an increased thickness, in accordance with an embodiment.

Referring now to FIG. 2E, a cross-sectional illustration of a bridge 230 is shown, in accordance with an additional embodiment. In an embodiment, the bridge 230 in FIG. 2E is substantially similar to the bridge 230 in FIG. 2A, with the exception that the power delivery layer 235 is segmented. That is, the power delivery layer 235 may comprise a plurality of power delivery segments $235_1$ and $235_2$. In an embodiment, the power delivery segments $235_1$ and $235_2$ are electrically isolated from each other. Therefore, multiple power rails may be provided along a single power delivery layer 235. For example, an IO power rail and a core power rail may be provided along a single layer of the routing stack 232.

In the illustrated embodiment, a pair of power delivery segments $235_1$ and $235_2$ are provided. However, it is to be appreciated that any number of power delivery segments $235_{1-n}$ may be provided in accordance with the power delivery needs of an electronic package. Furthermore, while the segmented power delivery layer 235 is shown as the bottom layer in FIG. 2E, it is to be appreciated that a segmented power delivery layer 235 may be positioned in any of the positions such as those described above with respect to FIGS. 2A-2D.

Figure 3A:
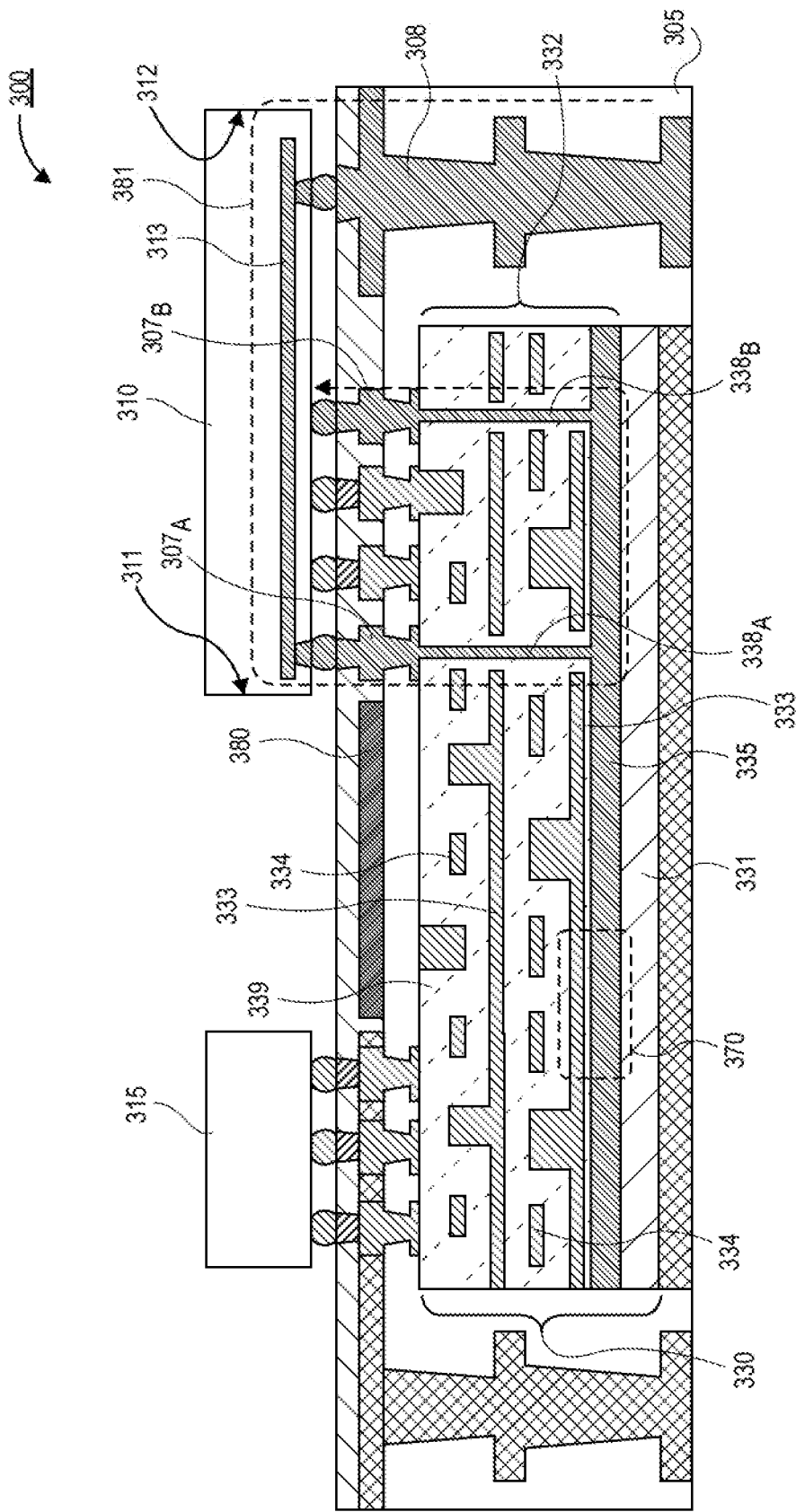
FIG. 3A is a cross-sectional illustration of an electronic package with an EMIB architecture that includes an EMIB with an additional routing layer for power delivery, in accordance with an embodiment.

Referring now to FIG. 3A, a cross-sectional illustration of an electronic package 300 is shown, in accordance with an embodiment. In an embodiment, the electronic package 300 may comprise a package substrate 305, a first die 310, and a second die 315. In an embodiment, the package substrate 305 may comprise an organic material. The package substrate 305 may also include conductive features, such as vias 308 to provide electrical connections through the package substrate 305.

In an embodiment, the first die 310 may be communicatively coupled to the second die 315 by a bridge 330. In an embodiment, the first die 310 may be a processor die (e.g., SoC) and the second die 315 may be a memory die. In an embodiment, the bridge 330 may be embedded in the package substrate 305. The bridge 330 may be similar to any of the bridges 230 described above with respect to FIGS. 2A-2E. For example, the bridge 330 may comprise a substrate 331 and a routing stack 332. The substrate 331 may comprise a suitable material, such as silicon, glass, a ceramic, or the like. In an embodiment, the routing stack 332 may comprise conductive features embedded in an insulating layer 339. The conductive features may comprise signal layers 334 and reference layers 333. For example, the reference layers 333 may be held at ground potential or another reference potential. In an embodiment, the conductive features in the routing stack 332 may also comprise a power delivery layer 335. The power delivery layer 335 may have a thickness that is greater than a thickness of the signal layers 334 and the reference layers 333.

In an embodiment, the first die 310 and the second die 315 may be positioned at least partially over the bridge 330. In an embodiment, one or both of the first die 310 and the second die 315 may also be positioned over the package substrate 305. That is, one or both of the first die 310 and the second die 315 may extend past an edge of the bridge 330. For example, the first die 310 extends past the right edge of the bridge 330 and is over the package substrate 305.

In the illustrated embodiment, a power rail 381 is shown. The power rail 381 includes an electrical path that passes through the package substrate 305, through the first die 310, and through the bridge 330. For example, the power rail 381 may be fed to the right edge 312 of the first die 310 by a via 308 and other conductive features of the package substrate 305. The power rail 381 may then pass laterally through a metal layer 313 of the first die 310. The metal layer 313 may be a metal layer of the BEOL stack of the first die 310. In an embodiment, the power rail 381 may continue to a first pad $307_A$ on the package substrate 305 above the bridge 330. The first pad $307_A$ is connected to the bridge 330, and a first via $338_A$ couples the first pad $307_A$ to the power delivery layer 335. The power delivery layer 335 provides lateral displacement of the power rail 381 to a second via $338_B$ that extends up towards a second pad $307_B$.

In a particular embodiment, the power rail 381 may be a Vdd logic power rail or an IO power rail. Since the power delivery layer 335 is a dedicated thick metal layer, it significantly reduces the voltage drop for the power rail 381 since it offers a parallel current flowing path in addition to the metal layer 313 of the first die 310. As such, low resistance power delivery is provided even when the metal layer 313 is not thick, and the resistance of the power rail 381 may be agnostic to the design of the first die 310. This allows for first dies from various manufacturers to be used without the need to redesign the power rail 381 in order to meet desired metrics.

Additionally, the use of a power delivery layer 335 in the bridge 330 frees up an edge of the first die 310 to receive an additional power rail. For example, a second power rail 380 may be supplied to the left edge 311 and/or right edge 312 of the first die 310 from the surface of the package substrate. This provides improved performance to the electronic package 300 and increases design flexibility. For example, the power rail 381 may be a Vdd logic power rail and the second power rail 380 may be an IO logic power rail.

Figure 3B:
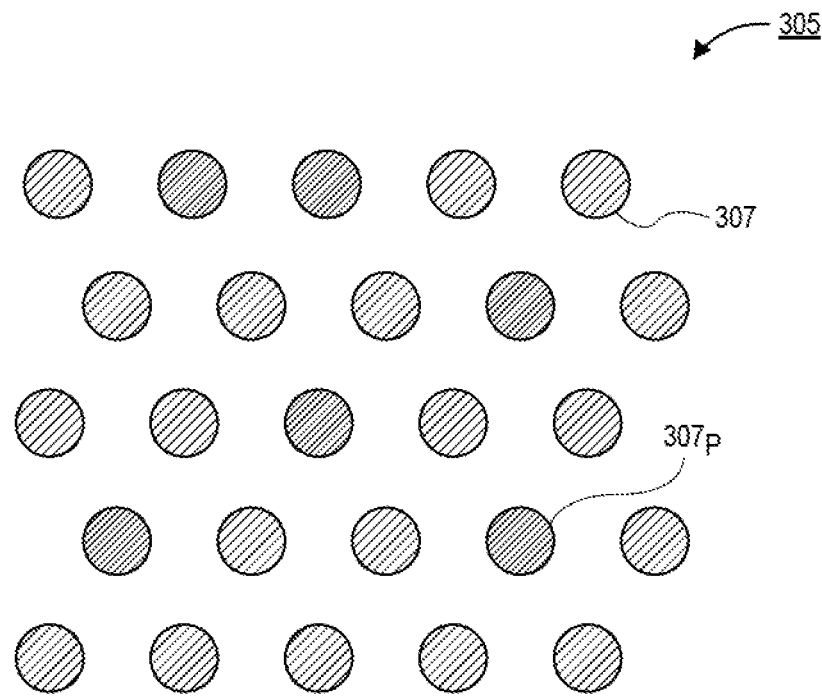
FIG. 3B is a plan view illustration of a bump map of an electronic package that illustrates the flexibility in positioning the power bumps, in accordance with an embodiment.

While a single second pad $307_B$ is shown, it is to be appreciated that the power rail 381 may be fed vertically to any number of pads 307 below the first die 310 to supply power. Referring now to FIG. 3B, a plan view illustration of the package substrate 305 that illustrates a portion of the pads 307 in the bumping region is shown, in accordance with an embodiment. A plurality of power pads $307_P$ are shown. The power pads $307_P$ may be located at any location in the bumping region. This is because vertical connections to the power pads $307_P$ are provided from the underlying power delivery layer 335 in the bridge 330. That is, the power pads $307_P$ do not each need to be adjacent to another power pad $307_P$. This is in contrast to the bump map described above in FIG. 1B, where the power pads 107 were required to be neighboring each other to provide a continuous trace along the surface of the package substrate 105. Accordingly, there is an increased flexibility in the design of the bump map in accordance with embodiments described herein. Additionally, providing a plurality of power pads 307 decreases the current density along each power pad 307. Accordingly, reliability is improved.

Figure 3C:
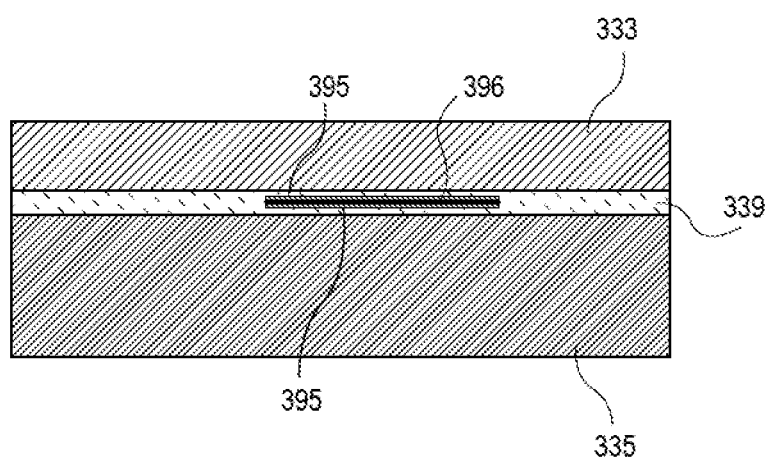
FIG. 3C is a cross-sectional illustration of a capacitor that is disposed in the bridge and which includes the power delivery routing layer and a ground reference routing layer as electrodes, in accordance with an embodiment.

Referring now to FIG. 3C, a zoomed in cross-sectional illustration of a region 370 in FIG. 3A is shown, in accordance with an embodiment. As shown, a reference layer 333 is separated from the power delivery layer 335 by an insulating layer 339. Between the power delivery layer 335 and the reference layer 333, a capacitor may be inserted. For example, thin capacitor plates 395 for power and ground and a thin high-k dielectric layer 396 between the capacitor plates 395 are positioned between the power delivery layer 335 and the reference layer 333 to form the metal-insulator-metal (MIM) capacitors. Accordingly, a capacitor (e.g., a MIM capacitor) can be provided substantially across the entire bridge 330. The on-bridge MIM capacitance significantly improves the power integrity of the electronic package 300 including improvements in voltage droop and transient noise. Furthermore, the inclusion of MIM capacitance on the bridge 330 reduces the need for MIM capacitors to be integrated into the first die 310 and/or the second die 315.

Figure 3D:
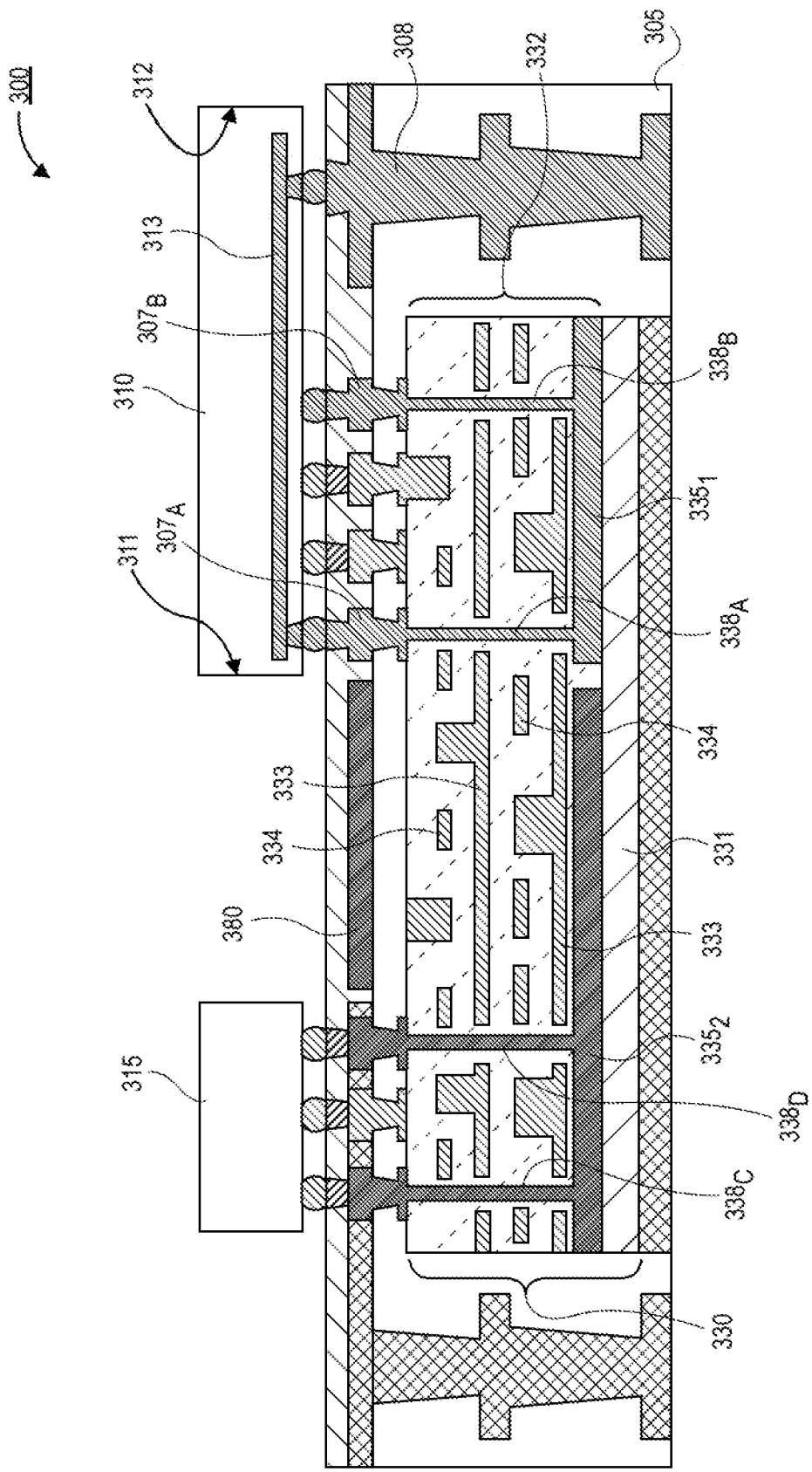
FIG. 3D is a cross-sectional illustration of an electronic package with an EMIB architecture that includes an EMIB with an additional routing layer for power delivery, where the routing layer is segmented to provide a plurality of different power rails, in accordance with an embodiment.

Referring now to FIG. 3D, a cross-sectional illustration of an electronic package 300 is shown, in accordance with an additional embodiment. In an embodiment, the electronic package 300 in FIG. 3D may be substantially similar to the electronic package in FIG. 3A, with the exception that the bridge 330 provides a plurality of power delivery segments (e.g., a first power delivery segment $335_1$ and a second power segment $335_2$) in the power delivery layer. In the illustrated embodiment, the first power delivery segment $335_1$ feeds the first die 310 with vias $338_A$ and $338_B$, and the second power delivery segment $335_2$ feeds the second die 315 with vias $338_C$ and $338_D$. For example, the first power delivery segment $335_1$ may be part of a first power rail for supplying Vdd logic power to the first die 310, and the second power delivery segment $335_2$ may be part of a second power rail for supplying IO power to the second die 315. In an embodiment, both of the first power delivery segment $335_1$ and the second power delivery segment $335_2$ may supply power to either the first die 310 and/or the second die 315.

Figure 4:
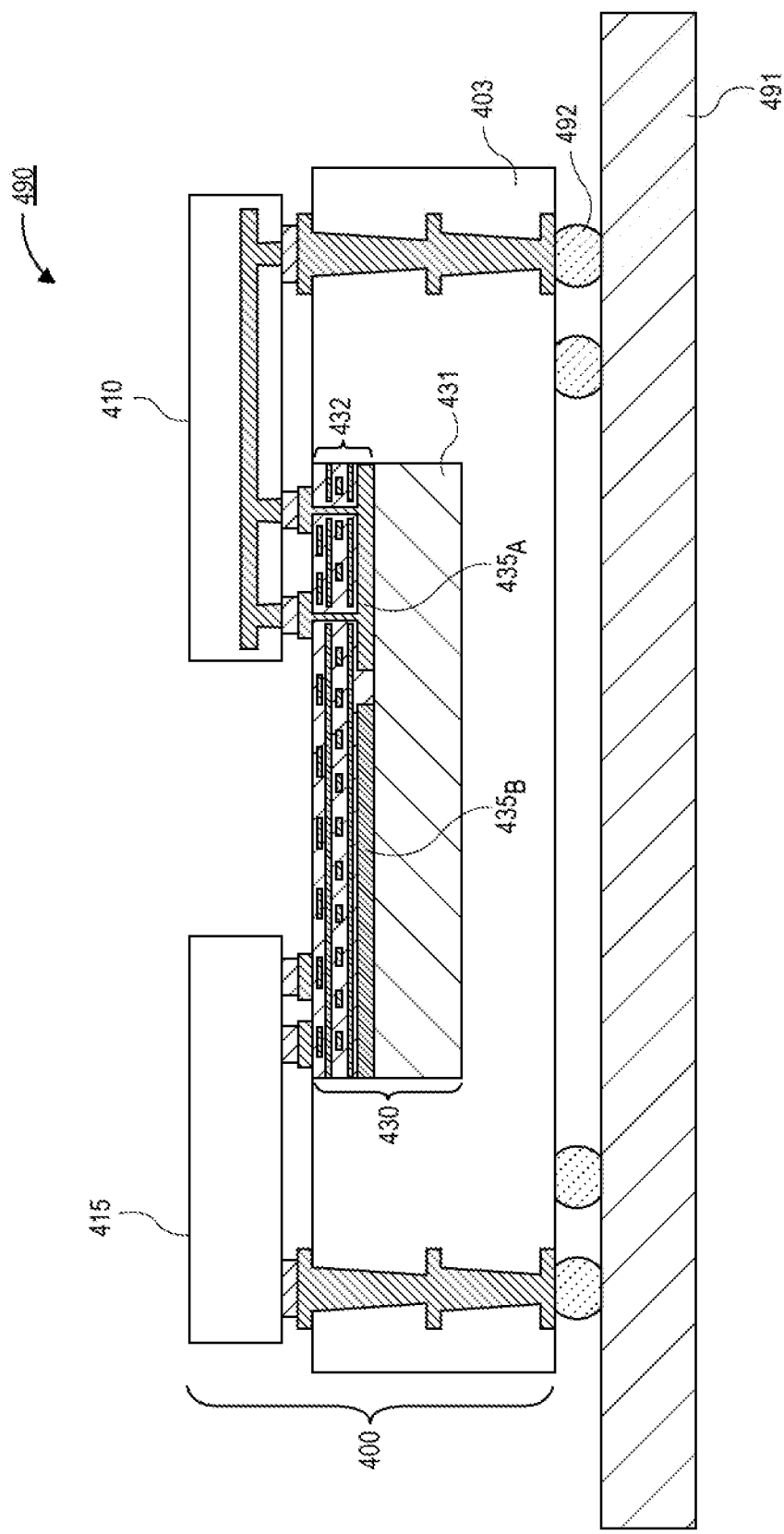
FIG. 4, is a cross-sectional illustration of an electronic system that comprises an electronic package with an EMIB architecture with an additional routing layer for power delivery, in accordance with an embodiment.

Referring now to FIG. 4, a cross-sectional illustration of an electronic system 490 is shown, in accordance with an embodiment. In an embodiment, the electronic system 490 may comprise a board 491 (e.g., a motherboard or the like) and an electronic package 400 attached to the board 491 by interconnects 492. In the illustrated embodiment, the interconnects 492 are shown as being solder bumps. However, it is to be appreciated that any suitable interconnect architecture may be used for the interconnects 492 (e.g., sockets, wire bonds, etc.).

In an embodiment, the electronic package 400 may be similar to any of the electronic packages described above. For example, the electronic package 400 may comprise a package substrate 403 with a plurality of dies (e.g., first die 410 and second die 415) over the package substrate 403. A bridge 430 may be embedded in the package substrate 403. In an embodiment, the bridge 430 may be similar to any of the bridge architectures described above. For example, the bridge 430 may comprise a substrate 431 and a routing stack 432. In an embodiment, the routing stack 432 may comprise a power delivery layer 435. For example, the power delivery layer 435 may comprise a first power delivery segment 435A and a second power delivery segment 435B. In other embodiment, the power delivery layer 435 may be a single conductive plane.

Figure 5:
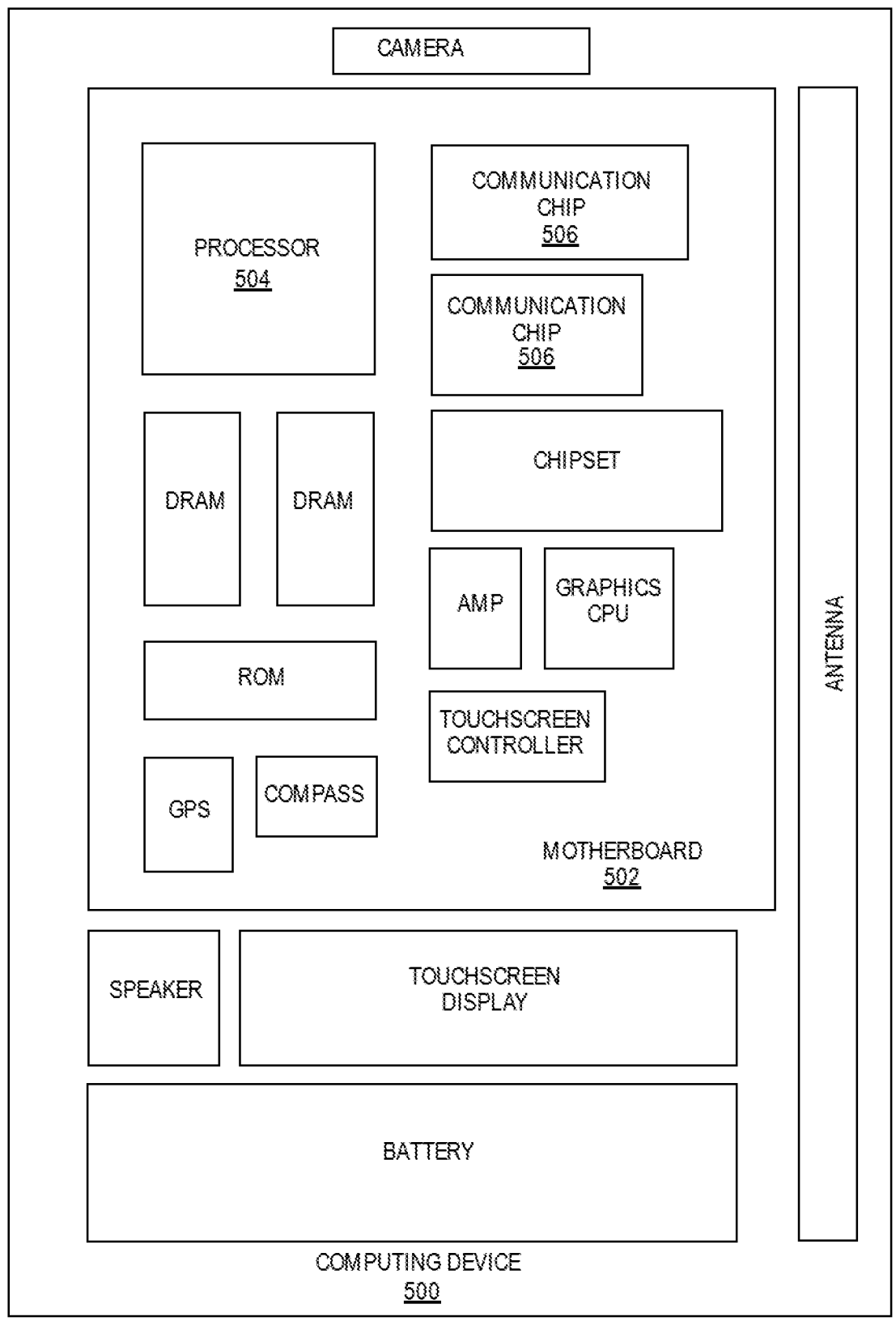
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be part of an electronic package that comprises a bridge with a dedicated power delivery layer, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip 506 may be part of an electronic package that comprises a bridge with a dedicated power delivery layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a bridge, comprising: a substrate; a routing stack over the substrate, wherein the routing stack comprises: first routing layers, wherein individual ones of the first routing layers have a first thickness; and a second routing layer, wherein the second routing layer has a second thickness that is greater than the first thickness.

Example 2: the bridge of Example 1, wherein the second routing layer comprises a plurality of sub-layers, wherein individual ones of the sub-layers have thicknesses between 1 µm and 4 µm.

Example 3: the bridge of Example 1 or Example 2, wherein there are at least four first routing layers.

Example 4: the bridge of Examples 1-3, wherein the second thickness is at least twice the first thickness.

Example 5: the bridge of Examples 1-4, wherein the second thickness is approximately 4 µm or greater.

Example 6: the bridge of Examples 1-5, wherein the second routing layer is between the first routing layers and the substrate.

Example 7: the bridge of Examples 1-5, wherein the first routing layers are between the second routing layer and the substrate.

Example 8: the bridge of Examples 1-5, wherein the second routing layer is between a pair of first routing layers.

Example 9: the bridge of Examples 1-8, further comprising: a plurality of pads over the routing stack.

Example 10: the bridge of Example 9, wherein a first pad of the plurality of pads is electrically coupled to the second routing layer by a first via, and a second pad of the plurality of pads is electrically coupled to the second routing layer by a second via, and wherein the first pad is electrically coupled to the second pad by a path comprising the first via, the second routing layer, and the second via.

Example 11: the bridge of Example 10, wherein a third pad of the plurality of pads is positioned between the first pad and the second pad.

Example 12: the bridge of Examples 1-11, wherein the second routing layer comprises a first segment and a second segment, and wherein the first segment is electrically isolated from the second segment.

Example 13: the bridge of Examples 1-12, wherein the second routing layer is a mesh.

Example 14: an electronic package, comprising: a package substrate; a bridge embedded in the package substrate, wherein the bridge comprises: a substrate; a routing stack over the substrate, wherein the routing stack comprises a first routing layer with a first thickness and a second routing layer with a second thickness, wherein the second thickness is greater than the first thickness; a first die electrically coupled to the bridge; and a second die electrically coupled to the bridge, wherein the first die is electrically coupled to the second die by the first routing layer.

Example 15: the electronic package of Example 14, further comprising a first power rail for the first die.

Example 16: the electronic package of Example 15, wherein the second routing layer is part of the first power rail.

Example 17: the electronic package of Example 16, wherein the first power rail includes a metal layer in the first die.

Example 18: the electronic package of Example 16, wherein the first power rail feeds power to a plurality of bumps that connect the first die to the bridge.

Example 19: the electronic package of Example 18, wherein individual ones of the plurality of bumps are electrically coupled to the second routing layer by a via in the routing stack.

Example 20: electronic package of Examples 14-19 wherein the second routing layer comprises a first segment for a first power rail and a second segment for a second power rail.

Example 21: the electronic package of Examples 14-20, wherein the first die is a processor die, and wherein the second die is a memory die.

Example 22: the electronic package of Examples 14-21, wherein the routing stack comprises at least four first routing layers.

Example 23: the electronic package of Example 22, further comprising: a capacitor on the bridge, wherein a first electrode of the capacitor is the second routing layer and a second electrode of the capacitor is one of the reference layers.

Example 24: an electronic system, comprising: a board; a package substrate attached to the board; a bridge embedded in the package substrate, wherein the bridge comprises at least five routing layers, and wherein at least one of the routing layers has a first thickness that is greater than a second thickness of other routing layers; a first die coupled to the bridge; and a second die coupled to the bridge, wherein the first die is electrically coupled to the second die by one or more of the routing layers.

Example 25: the electronic system of Example 24, wherein a power rail for the first die comprises at least a portion of the routing layer with the first thickness.

What is claimed is:

1. A bridge, comprising:
   a silicon substrate;
   a routing stack over the silicon substrate, wherein the routing stack comprises:
     a first routing layer, wherein the first routing layer has a first thickness;
     a second routing layer, wherein the second routing layer has a second thickness that is greater than the first thickness; and
     a third routing layer having the first thickness, wherein the second routing layer is vertically between the first routing layer and the third routing layer.

2. The bridge of claim 1, wherein the second routing layer comprises a plurality of sub-layers, wherein individual ones of the sub-layers have thicknesses between 1 μm and 4 μm.

3. The bridge of claim 1, wherein there are at least four first routing layers.

4. The bridge of claim 1, wherein the second thickness is at least twice the first thickness.

5. The bridge of claim 1, wherein the second thickness is approximately 4 μm or greater.

6. The bridge of claim 1, wherein the first routing layer is between the second routing layer and the silicon substrate.

7. The bridge of claim 1, further comprising:
   a plurality of pads over the routing stack.

8. The bridge of claim 7, wherein a first pad of the plurality of pads is electrically coupled to the second routing layer by a first via, and a second pad of the plurality of pads is electrically coupled to the second routing layer by a second via, and wherein the first pad is electrically coupled to the second pad by a path comprising the first via, the second routing layer, and the second via.

9. The bridge of claim 8, wherein a third pad of the plurality of pads is positioned between the first pad and the second pad.

10. The bridge of claim 1, wherein the second routing layer comprises a first segment and a second segment, and wherein the first segment is electrically isolated from the second segment.

11. The bridge of claim 1, wherein the second routing layer is a mesh.

12. An electronic package, comprising:
    a package substrate;
    a bridge embedded in the package substrate, wherein the bridge comprises:
      a silicon substrate;
      a routing stack over the silicon substrate, wherein the routing stack comprises a first routing layer with a first thickness and a second routing layer with a second thickness and a third routing layer with the first thickness, wherein the second thickness is greater than the first thickness, and wherein the second routing layer is vertically between the first routing layer and the third routing layer;
    a first die electrically coupled to the bridge; and
    a second die electrically coupled to the bridge, wherein the first die is electrically coupled to the second die by the first routing layer.

13. The electronic package of claim 12, further comprising a first power rail for the first die.

14. The electronic package of claim 13, wherein the second routing layer is part of the first power rail.

15. The electronic package of claim 14, wherein the first power rail includes a metal layer in the first die.

16. The electronic package of claim 14, wherein the first power rail feeds power to a plurality of bumps that connect the first die to the bridge.

17. The electronic package of claim 16, wherein individual ones of the plurality of bumps are electrically coupled to the second routing layer by a via in the routing stack.

18. The electronic package of claim 12 wherein the second routing layer comprises a first segment for a first power rail and a second segment for a second power rail.

19. The electronic package of claim 12, wherein the first die is a processor die, and wherein the second die is a memory die.

20. The electronic package of claim 12, wherein the routing stack comprises at least four first routing layers.

21. The electronic package of claim 20, further comprising:
    a capacitor on the bridge, wherein a first electrode of the capacitor is the second routing layer and a second electrode of the capacitor is one of the reference layers.

22. An electronic system, comprising:
    a board;
    a package substrate attached to the board;
    a bridge embedded in the package substrate, wherein the bridge comprises at least five routing layers above a silicon substrate, and wherein at least one of the routing layers has a first thickness that is greater than a second thickness of other routing layers, the at least one of the routing layers vertically between a first one and a second one of the other routing layers;
    a first die coupled to the bridge; and a second die coupled to the bridge, wherein the first die is electrically coupled to the second die by one or more of the routing layers.

23. The electronic system of claim 22, wherein a power rail for the first die comprises at least a portion of the routing layer with the first thickness.

* * * * *